(12) United States Patent
Tsubaki et al.

(10) Patent No.: US 9,119,287 B2
(45) Date of Patent: Aug. 25, 2015

(54) DISPLAY DEVICE AND ELECTRONIC APPARATUS

(71) Applicant: Japan Display Inc., Tokyo (JP)

(72) Inventors: Yuichi Tsubaki, Tokyo (JP); Satoru Yamaguchi, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/177,789

(22) Filed: Feb. 11, 2014

(65) Prior Publication Data

US 2014/0240961 A1  Aug. 28, 2014

(30) Foreign Application Priority Data

Feb. 27, 2013  (JP) ................................ 2013-038031

(51) Int. Cl.
| | |
|---|---|
| *F21V 7/04* | (2006.01) |
| *H05K 7/00* | (2006.01) |
| *B60R 11/02* | (2006.01) |
| *B60R 11/00* | (2006.01) |

(52) U.S. Cl.
CPC .............. *H05K 7/00* (2013.01); *B60R 11/0235* (2013.01); *B60R 2011/0005* (2013.01); *B60R 2011/0047* (2013.01)

(58) Field of Classification Search
CPC ................................................ G02F 1/133608
USPC .................................................. 362/633, 634
See application file for complete search history.

(56) References Cited

U.S. PATENT DOCUMENTS

| | | | | |
|---|---|---|---|---|
| 6,667,780 | B2 * | 12/2003 | Cho ................................. | 349/58 |
| 7,226,201 | B1 * | 6/2007 | Li et al. ......................... | 362/633 |
| 7,898,616 | B2 * | 3/2011 | Yu .................................... | 349/65 |
| 8,233,015 | B2 * | 7/2012 | Lee ................................ | 345/156 |
| 8,421,950 | B2 * | 4/2013 | Kim et al. ........................ | 349/58 |
| 2004/0170009 | A1 * | 9/2004 | Ho .................................. | 362/31 |
| 2005/0162868 | A1 * | 7/2005 | Kim ............................... | 362/632 |
| 2008/0143918 | A1 * | 6/2008 | Kim ................................. | 349/58 |
| 2009/0185097 | A1 * | 7/2009 | Kim et al. ....................... | 349/58 |
| 2011/0149583 | A1 * | 6/2011 | Wang ............................ | 362/455 |
| 2012/0206940 | A1 * | 8/2012 | Han et al. ..................... | 362/609 |

FOREIGN PATENT DOCUMENTS

JP   11-007000   1/1999

* cited by examiner

*Primary Examiner* — Jong-Suk (James) Lee
*Assistant Examiner* — Bryon T Gyllstrom
(74) *Attorney, Agent, or Firm* — K&L Gates LLP

(57) ABSTRACT

A hook portion projecting outward is provided on a side plate portion of an upper case. An upper case includes a support surface that supports a display surface of a display panel. A lower case includes a sidewall that faces an outer circumferential side of the side plate portion. The sidewall has an opening into which the hook portion is inserted. The hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface.

4 Claims, 6 Drawing Sheets

DISPLAY DEVICE AND ELECTRONIC APPARATUS

CROSS REFERENCES TO RELATED APPLICATIONS

The present application claims priority to Japanese Priority Patent Application JP 2013-038031 filed in the Japan Patent Office on Feb. 27, 2013, the entire content of which is hereby incorporated by reference.

BACKGROUND

1. Technical Field

The present disclosure relates to a display device and an electronic apparatus in which an upper case to which a display cover of a display panel is pasted is fixed to a lower case.

2. Description of the Related Art

There are liquid crystal display devices as display devices mounted in, for example, vehicle on-board navigation systems. The liquid crystal display device includes a liquid crystal display (LCD) panel (liquid crystal panel) having a display surface composed of thin glass. Thus, the LCD panel, when used in an exposed state, could be broken by an external force or an impact. To prevent this, some liquid crystal display devices include an LCD panel, the display surface side of which is fixed to a transparent cover window (cover glass) through which the display surface is visible. The cover window can cover the display surface of the LCD panel to protect it.

Some liquid crystal display devices include an LCD panel, a display cover disposed on the display surface side of the LCD panel, a frame-like display cover support case (upper case) that supports and fixes an outer circumferential portion of the display cover, a backlight, and a housing case (lower case) that houses the backlight and into which the display cover support case is fitted. For example, Japanese Patent Application Laid-open Publication No. 11-7000 discloses a liquid crystal display device in which projecting hook portions are provided on a sidewall of an upper case (or lower case) while openings are formed on a sidewall of a lower case (or upper case), and the hooks are fitted into the openings so as to fix the upper case to the lower case.

When the liquid crystal display device disclosed in Japanese Patent Application Laid-open Publication No. 11-7000 is manufactured or reworked (reassembled), the entire upper case (or lower case) is deformed and fitted into the lower case (or upper case). This causes difficulties in the fitting work and a removal work between the upper case and the lower case during the manufacturing or the rework. In the case in which, as described above, the upper case is the display cover support case that supports and fixes the outer circumferential portion of the display cover disposed on the display surface side of the LCD panel, deforming the upper case when fitting or removing the upper case into or from the lower case applies a physical load to the LCD panel and the display cover. Not limited to the liquid crystal display device including the LCD panel, any display device including a display panel has the same problem.

SUMMARY

According to an aspect, a display device comprises: a display panel comprising a display surface that displays an image; an upper case comprising a support surface that supports the display surface of the display panel and a side plate portion that is provided along an outer edge of the support surface and extends from the outer edge of the support surface in a direction orthogonal to the display surface, the side plate portion being provided, at least at one place of the side plate portion, with a hook portion that projects on a surface on an outer circumferential side of the side plate portion in a direction orthogonal to a surface of the side plate portion; and a lower case comprising a bottom surface parallel to the display surface and a sidewall that is provided around the bottom surface, extends in a direction orthogonal to the bottom surface, and faces the outer circumferential side of the side plate portion, the sidewall being formed with an opening into which the hook portion is inserted, wherein the hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface.

Additional features and advantages are described herein, and will be apparent from the following Detailed Description and the figures.

DETAILED DESCRIPTION

Configuration of Liquid Crystal Display Device 1

Figure 1:
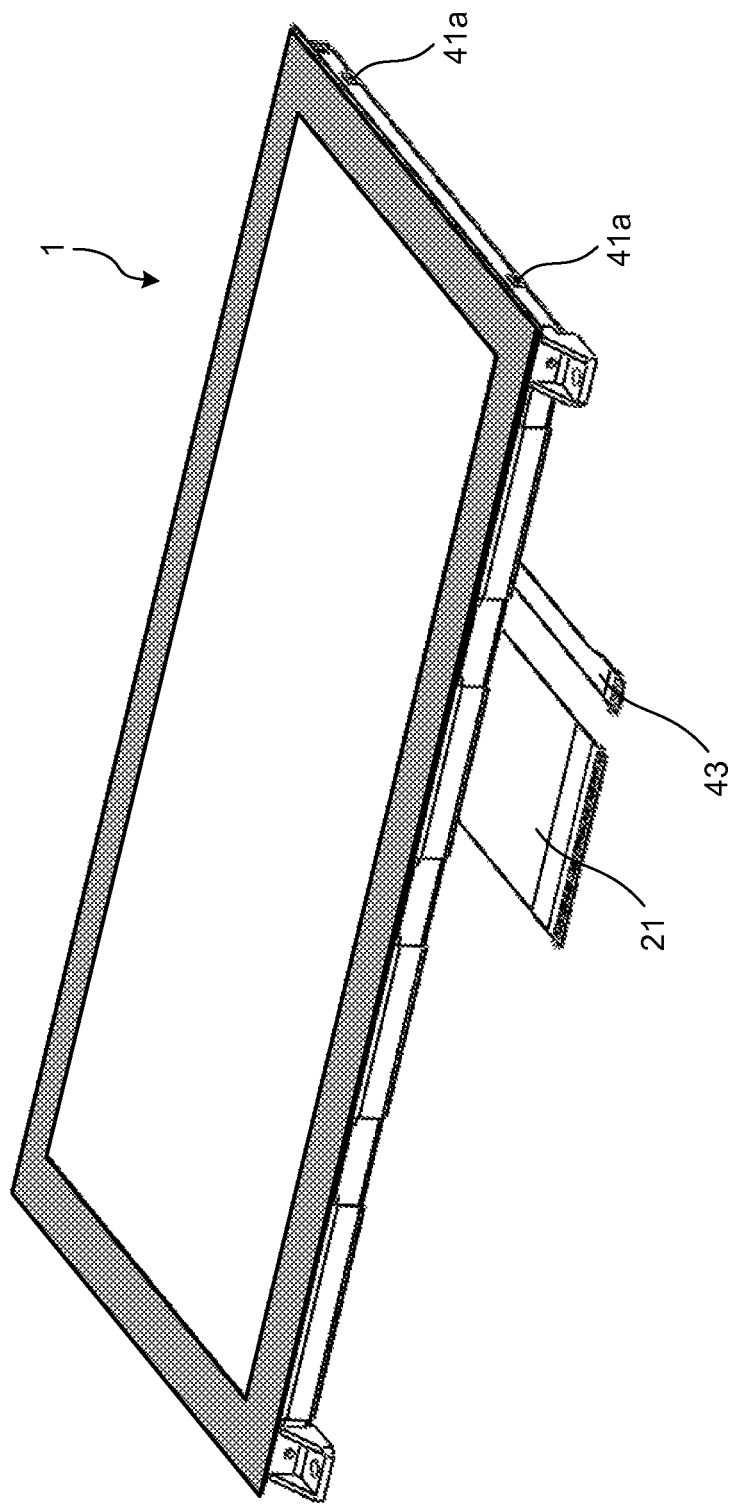
FIG. 1 is an overall perspective view of a liquid crystal display device as an example according to an embodiment of the present disclosure.
Figure 2:
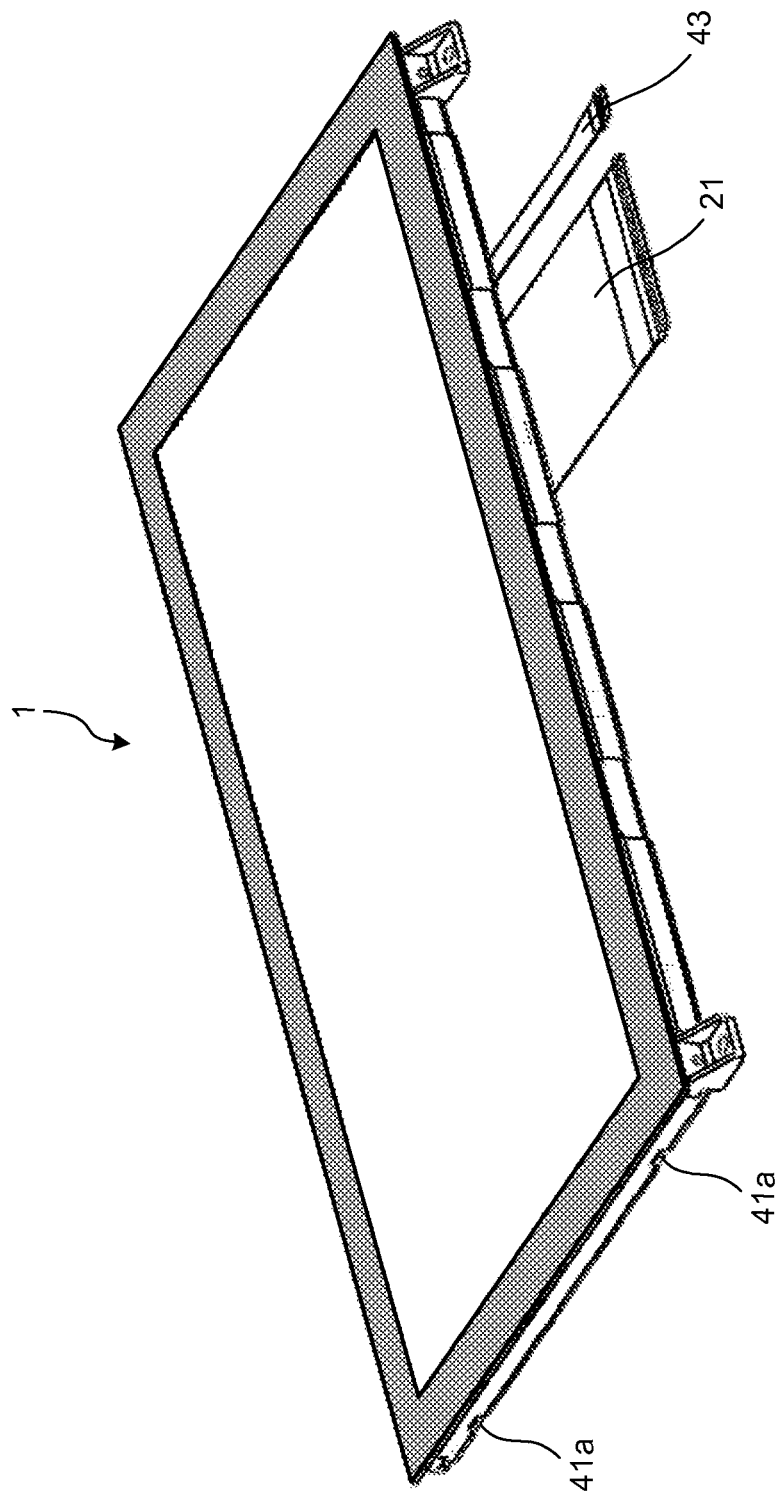
FIG. 2 is an overall perspective view of the liquid crystal display device of FIG. 1 when viewed from another direction.
Figure 3:
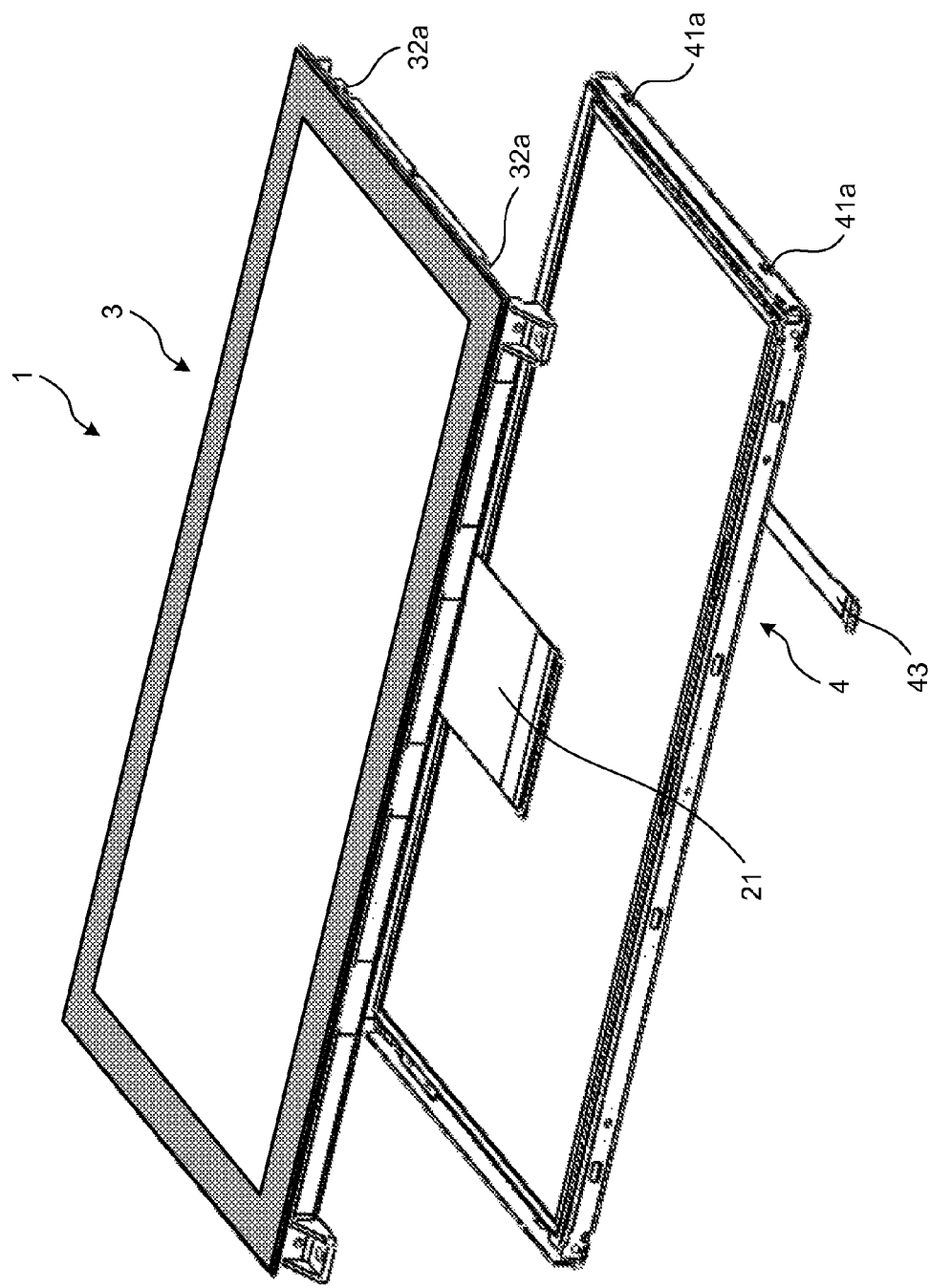
FIG. 3 is an exploded perspective view of the liquid crystal display device according to the embodiment.
Figure 4:
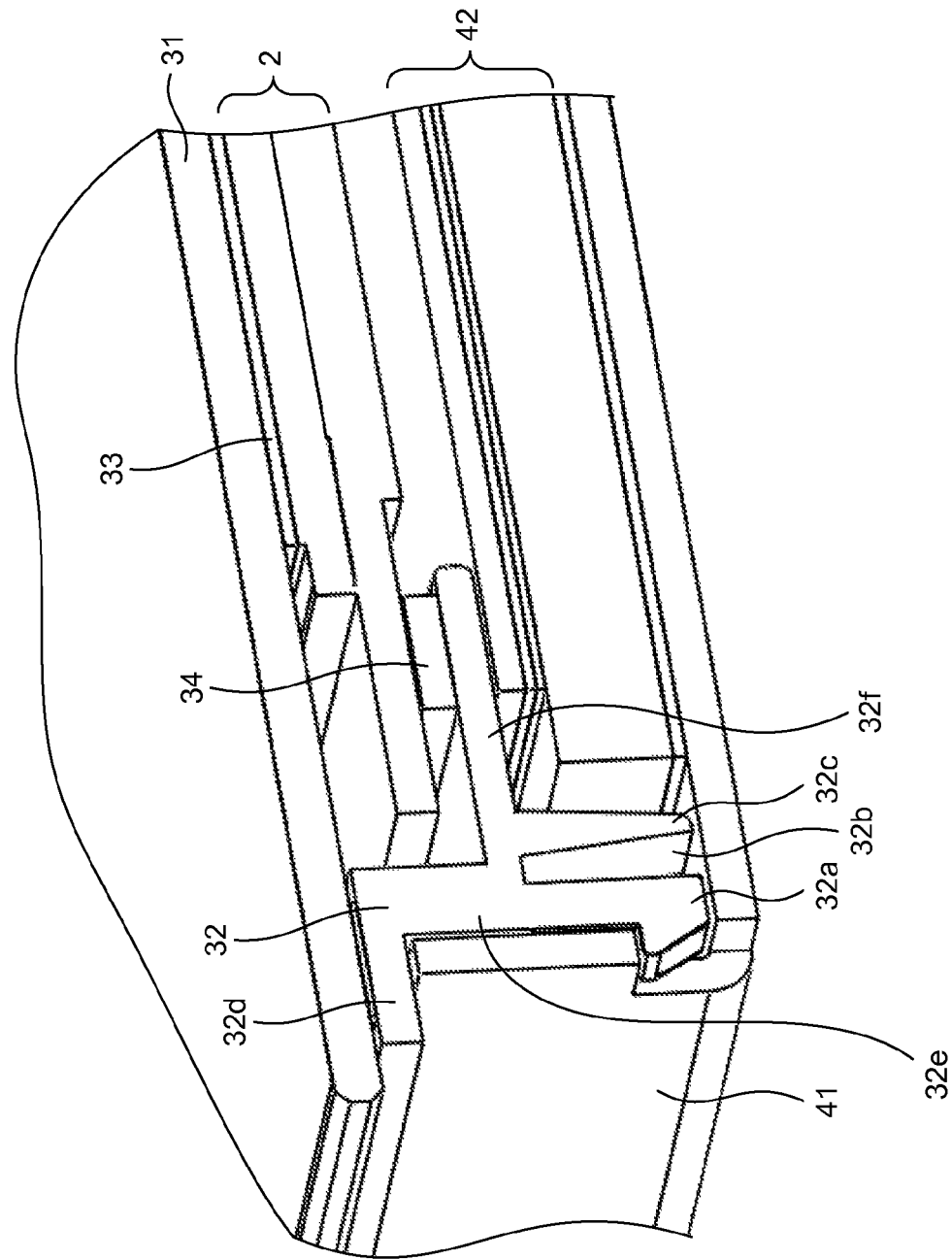
FIG. 4 is a sectional view of an essential part of the liquid crystal display device according to the embodiment into which an LCD panel unit and a backlight unit are fitted.

FIG. 1 is an overall perspective view of a liquid crystal display device as an example according to an embodiment of the present disclosure; FIG. 2 is an overall perspective view of the liquid crystal display device of FIG. 1 when viewed from another direction; FIG. 3 is an exploded perspective view of the liquid crystal display device; and FIG. 4 is a sectional view of an essential part of the liquid crystal display device according to the embodiment into which an LCD panel unit and a backlight unit are fitted. A configuration of this liquid crystal display device 1 according to the embodiment will be described with reference to FIGS. 1 to 4.

As illustrated in FIGS. 1 to 3, the liquid crystal display device 1 includes an LCD panel unit 3 that displays an image, and a backlight unit 4 that emits light. The liquid crystal display device 1 is composed of stacks of the LCD panel unit 3 and the backlight unit 4. The backlight unit 4 illuminates the LCD panel unit 3, and brings into view the image displayed on the LCD panel unit 3.

The LCD panel unit 3 includes an LCD panel (liquid crystal panel) 2, a cover glass 31, and a cover glass support case (upper case) 32.

The LCD panel 2 is a substrate in which a liquid crystal layer is provided between two transparent substrates and formed on the transparent substrates. The LCD panel 2 of the present embodiment is a liquid crystal display of a fringe field switching (FFS) type, one of whose transparent substrates being composed of stacks of drive electrodes (common) and pixel electrodes arranged in a matrix formed corresponding to pixels. At least one of the two transparent substrates is provided with a color filter in which filters of, for example, red (R), green (G), and blue (B) are arranged corresponding to the pixels. Either of the pixel electrode and the drive electrode (common) of the LCD panel 2 is formed with an opening. The LCD panel 2 drives the liquid crystal with an electric field (fringe electric field) leaked from the opening. The LCD panel 2 displays an image by switching between transmission and shielding of light at each of the pixels based on an image signal. A surface on which the pixels are arranged in a matrix, that is, a surface (panel surface, or front surface) having the largest area of the LCD panel 2 is disposed substantially parallel to an illumination surface of the backlight unit 4 (to be described later). While the embodiment illustrates the LCD panel 2 as the FFS type LCD panel, the type may be an in-plane switching (IPS) type, a twisted nematic (TN) type, an optically compensated bend (or optically compensated birefringence) (OCB) type, or an electrically controlled birefringence (ECB) type. The LCD panel 2 can use either a normally black mode in which black is displayed because the light is not transmitted when no voltage is applied, or a normally white mode in which white is displayed because the light is transmitted when no voltage is applied. The LCD panel 2 is connected to a flexible printed circuit (FPC) 21, as illustrated in FIG. 1. The FPC 21 is connected to an external device (control device) that transmits control signals to the LCD panel 2 to control display operations thereof.

The cover glass 31 is a transparent glass member that protects a display surface of the LCD panel 2 by covering it. As illustrated in FIG. 4, the cover glass 31 is disposed on the display side of the LCD panel 2, fixed to the LCD panel 2, and fixed to the cover glass support case 32 by, for example, adhesion. The cover glass 31 of the present embodiment adheres to the display surface of the LCD panel 2 with an ultraviolet curing resin (UV curing resin) 33. The UV curing resin 33 is a synthetic resin that reacts to light energy of ultraviolet rays to chemically change from a liquid to a solid.

The liquid crystal display device 1 of the present embodiment is provided with the cover glass 31 as a display cover that protects the surface on the display side (i.e., the display surface) of the LCD panel 2, and the cover glass 31 is fixed to the LCD panel 2. However, the liquid crystal display device 1 is not limited to this. The liquid crystal display device 1 can use various types of plate-like light-transmitting display covers, provided that they can protect the front surface of the LCD panel 2 and can transmit the image displayed on the LCD panel 2. A transparent resin member or a touch panel can be used as the display cover.

The cover glass support case 32 supports the cover glass 31 so as to support the LCD panel 2 fixed to the cover glass 31. The cover glass support case 32 is fitted into a housing case 41 of the backlight unit 4. The shape of the cover glass support case 32 will be described later.

The backlight unit 4 includes the housing case (lower case) 41 and a backlight 42.

The housing case 41 is a rectangular box-shaped case including a bottom surface and a sidewall that is provided on an outer circumference of the bottom surface and extends in a direction orthogonal to the bottom surface. The housing case 41 is made of metal. The backlight 42 is fixed to the bottom surface of the housing case 41. The housing case 41 serves as a light-shielding member that shields light emitted from the backlight 42 so as to prevent the light from leaking outward, and serves as a shield for the LCD panel 2 stacked on the backlight unit 4.

The backlight 42 is a mechanism that projects light to the LCD panel 2, and is disposed facing the LCD panel 2. The backlight 42 is housed in the housing case 41. The backlight 42 includes a light source that emits the light, a light guide plate that receives the light emitted from the light source and guides the received light to be projected toward the LCD panel 2, and an optical sheet stacked on the light projecting surface side of the light guide plate. The light source can use a light-emitting diode (LED) or a fluorescent lamp. A flexible cable 43 illustrated in FIG. 1 is connected to the light source. The flexible cable 43 extends toward the outside of the housing case 41 and the cover glass support case 32, and is connected to a source of power supply. While the backlight 42 in the present embodiment uses the light guide plate and emits the light from the emission surface of the light guide plate, the backlight 42 is not limited to this. The backlight 42 can use a point light source such as an LED or a linear light source such as a cold cathode fluorescent lamp (CCFL). A plurality of such point light sources or linear light sources may be arranged as the backlight 42 so as to make the light enter the whole area of the display surface of the LCD panel 2.

The shape of the cover glass support case 32 will be described. The cover glass support case 32 includes a pasting plate portion 32d, a side plate portion 32e, and a step portion 32f.

The pasting plate portion 32d has a frame shape facing the vicinity of the outer edge of a surface on the LCD panel 2 side of the cover glass 31. The cover glass 31 is fixed to a frame-shaped surface of the pasting plate portion 32d by, for example, adhesion.

The side plate portion 32e is provided on a surface (support surface) on the LCD panel 2 side of the pasting plate portion 32d, and formed along the frame-shaped pasting plate portion 32d. Thus, the side plate portion 32e is formed over the entire circumference so as to surround the LCD panel 2 along the outer edge of the surface on the LCD panel 2 side of the cover glass 31. The side plate portion 32e extends in a direction substantially orthogonal to the surface on the LCD panel 2 side of the pasting plate portion 32d. A part of the side plate portion 32e provided along each side on the outer edge of the surface on the LCD panel 2 side of the cover glass 31 has a plate shape with a short-side direction thereof being the direction substantially orthogonal to the surface on the LCD panel 2 side of the pasting plate portion 32d, a long-side direction thereof being a direction along the sides on the outer edge, and a thickness direction thereof being a direction orthogonal to these two directions. The outer surface of the side plate portion 32e of the cover glass support case 32 faces the inner surface of the sidewall of the box-shaped housing case 41 (to be described later). The cover glass support case 32 and the housing case 41 include mechanisms for fixing them to each other at the side plate portion 32e of the cover glass support case 32 and the sidewall of the housing case 41, respectively, facing each other. This will be described later.

The step portion 32f is connected to a surface on the inner circumferential side (on the center side of the display surface) of the side plate portion 32e, and extends substantially parallel to the plate surface of the pasting plate portion 32d. The step portion 32f faces an end of a surface on the backlight unit 4 side of the LCD panel 2. A surface of the step portion 32f on the side opposite to the surface facing the LCD panel 2 faces the backlight 42 of the backlight unit 4. A buffer member 34 is disposed between the step portion 32f and the LCD panel 2.

The cover glass support case 32 supports the LCD panel 2 by supporting the cover glass 31 to which the LCD panel 2 adheres. The step portion 32f of the cover glass support case 32 is provided on the backlight unit 4 side (also called a light source side) of the LCD panel 2, and the buffer member 34 is disposed between the step portion 32f and the LCD panel 2. The step portion 32f is also disposed between the LCD panel 2 and the backlight 42. This causes the cover glass support case 32 to support the backlight 42 in a predetermined position of the housing case 41. When a load of the backlight 42 is applied toward the LCD panel 2, receiving the load by the step portion 32f and the buffer member 34 keeps the load from being applied on the LCD panel 2 from the backlight unit 4 side.

Surrounding Structure of Hook Portion 32a of Cover Glass Support Case 32

Figure 5:
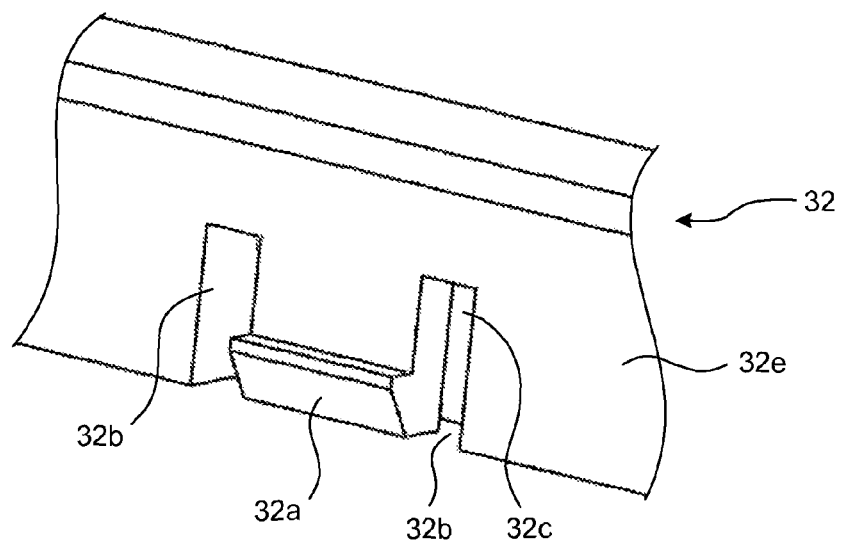
FIG. 5 is a view illustrating a hook portion provided on a cover glass support case of the liquid crystal display device according to the embodiment.
Figure 6:
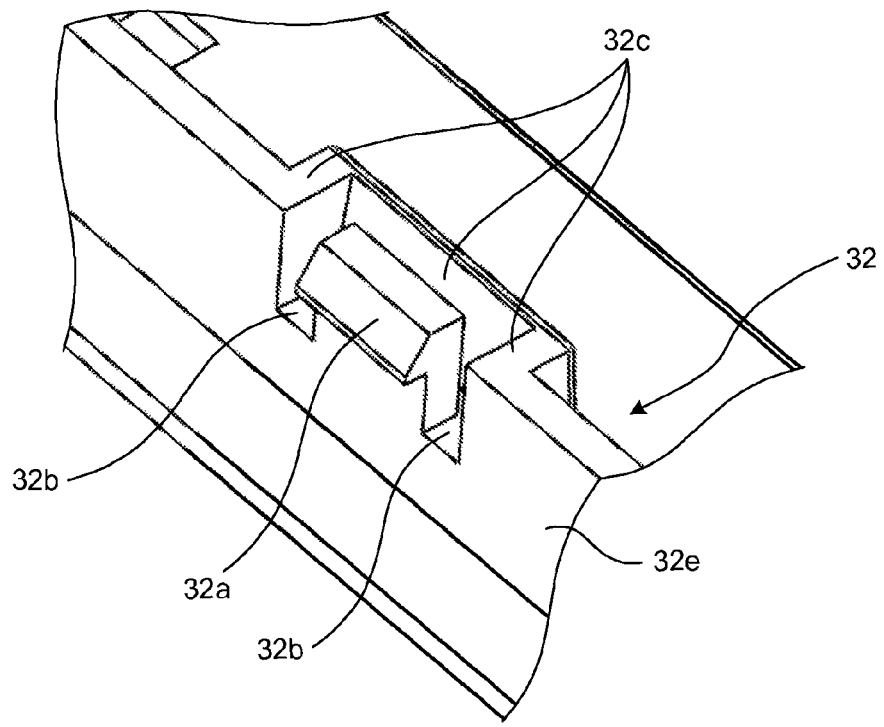
FIG. 6 is a perspective view, as viewed from a light source side, of the hook portion provided on the cover glass support case of the liquid crystal display device according to the embodiment.
Figure 7:
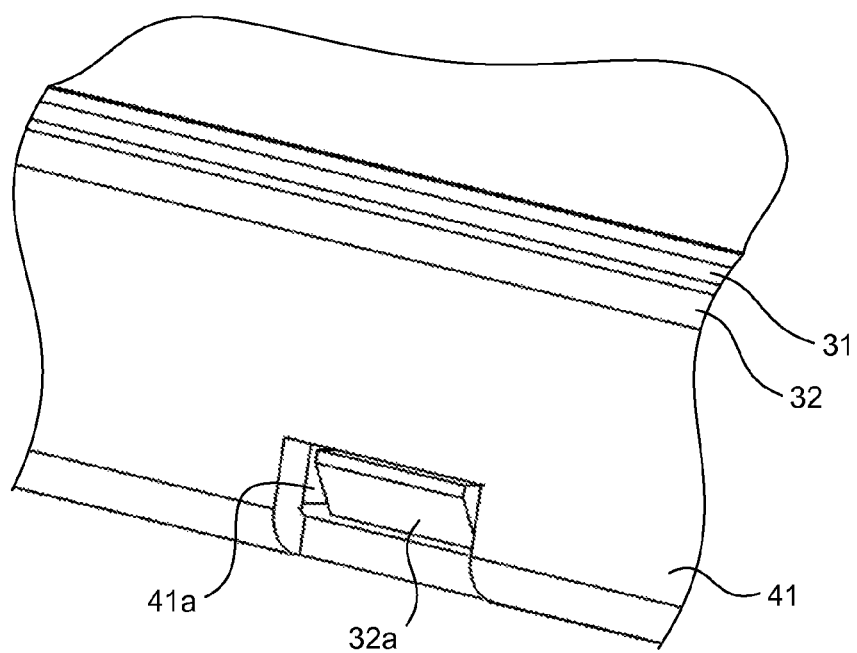
FIG. 7 is a view illustrating a state in which the hook portion is fitted into an opening of a housing case in the liquid crystal display device according to the embodiment.

FIG. 5 is a view illustrating a hook portion provided on the cover glass support case of the liquid crystal display device according to the embodiment; FIG. 6 is a perspective view of the hook portion as viewed from the light source side; and FIG. 7 is a view illustrating a state in which the hook portion is fitted into an opening of the housing case. With reference to FIGS. 4 to 7, descriptions will be made of a surrounding structure of a hook portion 32a provided on the cover glass support case 32 and a manner of fitting and removal between the cover glass support case 32 and the housing case 41.

The cover glass support case 32 is provided with the hook portions 32a at a plurality of places of the side plate portion 32e. The hook portion 32a has a shape projecting in a direction orthogonal to the surface of the side plate portion and is located on the surface facing the sidewall (i.e., on a surface on the outer circumferential side of the side plate portion 32e) and at an end on the light source side (on the backlight unit 4 side). The hook portion 32a has a smaller length in the direction orthogonal to the side plate portion 32e than a length in the direction orthogonal to the pasting plate portion 32d. The hook portion 32a is separated in an extending direction of the side plate portion 32e from other portions of the side plate portion 32e. This gives the hook portion 32a a shape that can be elastically deformed in the direction orthogonal to the side plate portion 32e. The projecting portion of the hook portion 32a has a projection shape whose end face on the LCD panel 2 side is substantially parallel to the surface of the pasting plate portion 32d and whose face on the opposite side is slanted relative to the surface of the pasting plate portion 32d. The side plate portion 32e of the cover glass support case 32 includes, in areas where the hook portions 32a are provided, protection walls 32c each of which is inwardly concaved (toward the center of the display surface in a plane parallel to the display surface of the LCD panel 2) so as to surround the hook portion 32a. The protection wall 32c is provided so as to be apart by a predetermined distance from the hook portion 32a in the plane parallel to the display surface, thus forming a gap (space) 32b between itself and the hook portion 32a.

As illustrated in FIGS. 1 to 3 and 7 mentioned above, the housing case 41 is formed with openings 41a at portions of the sidewall of the housing case 41 that face the hook portions 32a when the cover glass support case 32 is fitted into the housing case 41.

A description will be made of the manner of fitting and removal between the cover glass support case 32 and the housing case 41. First, the cover glass support case 32 of the LCD panel unit 3 is fitted into the housing case 41 from the side provided with the hook portions 32a so that the outer surface of the side plate portion 32e faces the inner surface of the sidewall of the housing case 41 of the backlight unit 4. At this time, a claw-like body of the hook portion 32a receives pressure from the inner surface of the sidewall of the housing case 41, and the cover glass support case 32 is fitted into the housing case 41 in the state in which only the hook portion 32a is elastically deformed inward. The LCD panel unit 3 including the cover glass support case 32 is fitted into a position where the hook portion 32a faces the opening 41a of the housing case 41. Specifically, the fitting of the backlight unit 4 with the LCD panel unit 3 returns the elastically deformed hook portion 32a to the original state thereof, and inserts the claw-like body at an end of on the backlight unit 4 side of the hook portion 32a into the opening 41a. The insertion of the hook portion 32a into the opening 41a causes the end face on the LCD panel unit 3 side of the claw-like body located at the end on the backlight unit 4 side to face an end face of the opening 41a. This causes the hook portion 32a to be hooked in the opening 41a when a movement occurs in a direction of separation between the backlight unit 4 and the LCD panel unit 3, thus restricting the movement in the direction of separation between the backlight unit 4 and the LCD panel unit 3. This can fix the backlight unit 4 to the LCD panel unit 3. In this manner, in the liquid crystal display device 1, the cover glass support case 32 of the LCD panel unit 3 is fitted with and fixed to the housing case 41 of the backlight unit 4. The fitting of the backlight unit 4 with the LCD panel unit 3 causes ends on the light source side of the side plate portion 32e and the protection wall 32c to substantially abut on the inner bottom surface of the housing case 41. As a result, in the liquid crystal display device 1, an inside space surrounded by the side plate portion 32e and the protection wall 32c is partitioned from an outside space, thus keeping foreign matter from entering from the outside into the inside space surrounded by the side plate portion 32e and the protection wall 32c.

When the cover glass support case 32 of the LCD panel unit 3 is to be removed from the housing case 41 of the backlight unit 4, the claw-like body of the hook portion 32a fitted in the opening 41a is first pressed to be elastically deformed toward the gap 32b on the inside. In the state in which the hook portion 32a is elastically deformed toward the gap 32b, the LCD panel unit 3 is pulled out in a direction of moving away from the housing case 41. At this time, the claw-like body of the hook portion 32a receives pressure from the inner surface of the sidewall of the housing case 41, and the cover glass support case 32 is pulled out of the housing case 41 in the state in which only the hook portion 32a is elastically deformed inward. Pulling out the LCD panel unit 3 including the cover glass support case 32 until the hook portion 32a comes out of the housing case 41 returns the elastically deformed hook portion 32a to the original state thereof. In this manner, the cover glass support case 32 of the LCD panel unit 3 is removed from the housing case 41 of the backlight unit 4.

As described above, in the liquid crystal display device 1, the LCD panel unit 3 can be fixed to the backlight unit 4 by fitting the cover glass support case 32 into the housing case 41 in the state in which only the hook portions 32a of the cover glass support case 32 are elastically deformed. This facilitates the fitting work and the removal work between the cover glass support case 32 and the housing case 41 when the liquid crystal display device 1 is manufactured or reworked. This also reduce a physical load applied to the whole of the LCD panel unit 3 and the backlight unit 4 because only the hook portions 32a need to be elastically deformed during the fitting work and the removal work between the cover glass support case 32 and the housing case 41.

As described above, the liquid crystal display device 1 is configured such that, when the cover glass support case 32 is fitted into and fixed to the housing case 41, the end on the light source side of the protection wall 32c provided on the side plate portion 32e substantially abuts on the inner bottom surface of the housing case 41, and the protection wall 32c partitions the space surrounded by the cover glass support case 32 and the housing case 41 from the outside thereof. This causes the protection wall 32c to shield the light emitted from the backlight 42, and thus can reduce leakage of the light emitted from the backlight 42 out of the housing case 41 through the opening 41a.

In the liquid crystal display device 1, the cover glass support case 32 is fitted to be fixed into the housing case 41, and the side plate portion 32e and the side face of the housing case 41 are fixed to each other in the state of facing each other. This allows the cover glass support case 32 to keep foreign matter from entering from a gap between itself and the housing case 41, and thus to keep the foreign matter from entering the periphery of the LCD panel 2. Providing further the protection walls 32c in the liquid crystal display device 1 can keep foreign matter, including dust, from entering the housing case 41 through the openings 41a and the gaps 32b.

While the liquid crystal display device 1 is configured such that the hook portions 32a are provided at a plurality of places of the end on the light source side of the side plate portion 32e of the cover glass support case 32, and the gaps 32b formed between the hook portions 32a and the protection walls 32c are open in the direction toward the light source of the side plate portions 32e, the configuration is not limited to this. Specifically, the inwardly concaved protection walls 32c may be provided between the display side and light source side ends of the side plate portion 32e, and the hook portions 32a may be provided so as to extend from inner walls on the light source side (or display side) toward the display side (or light source side) of concaved inner walls of the protection walls 32c. Such a structure can provide the same effect as that described above.

Manner of Mounting Liquid Crystal Display Device 1 on Automobile 101

Figure 8:
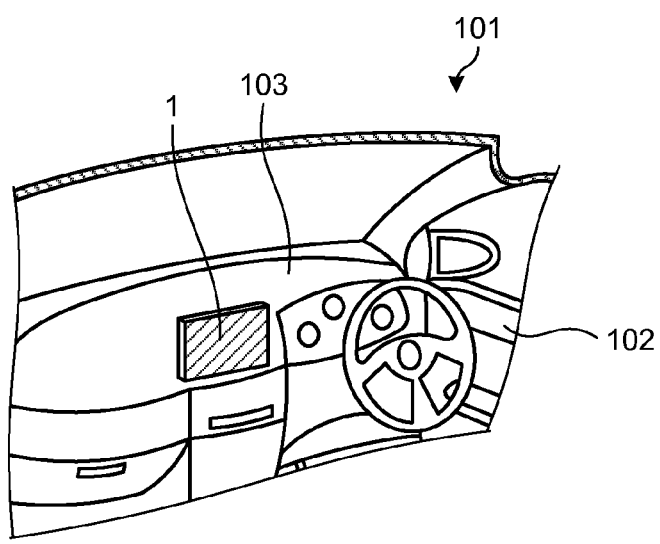
FIG. 8 is a view illustrating a state in which the liquid crystal display device according to the embodiment is installed on a dashboard of an automobile.

FIG. 8 is a view illustrating a state in which the liquid crystal display device according to the embodiment is installed on a dashboard of an automobile. As illustrated in FIG. 8, the liquid crystal display device 1 according to the present embodiment is installed, for example, on a dashboard 103 on the driver's seat side of a vehicle interior 102 of an automobile 101. In this case, the liquid crystal display device 1 is used for, for example, navigation display in a vehicle navigation system, display of a music operation screen, or movie playing display.

Besides the above-mentioned vehicle navigation system, a personal computer, an LCD television, and a mobile phone are exemplified as an electronic apparatus to which the liquid crystal display device 1 according to the embodiment described above can be applied.

The description given above does not limit the embodiment of the present disclosure. The constituent elements of the embodiment described above include elements easily conceived by those skilled in the art, substantially identical elements, and elements in the range of what are called equivalents. In addition, the constituent elements can be omitted, replaced, and/or modified in various ways within the scope not deviating from the gist of the embodiment described above. For example, while the display device and the electronic apparatus of the above-described embodiment have been described as the liquid crystal display device 1 using the LCD panel as a display panel for displaying an image and the electronic apparatus using the liquid crystal display device 1, the display panel is not limited to this. A panel other than the LCD panel can also be used as the display panel.

Aspects of Present Disclosure

The present disclosure includes the following aspects:

(1) A display device comprising:
   a display panel comprising a display surface that displays an image;
   an upper case comprising a support surface that supports the display surface of the display panel and a side plate portion that is provided along an outer edge of the support surface and extends from the outer edge of the support surface in a direction orthogonal to the display surface, the side plate portion being provided, at least at one place of the side plate portion, with a hook portion that projects on a surface on an outer circumferential side of the side plate portion in a direction orthogonal to a surface of the side plate portion; and
   a lower case comprising a bottom surface parallel to the display surface and a sidewall that is provided around the bottom surface, extends in a direction orthogonal to the bottom surface, and faces the outer circumferential side of the side plate portion, the sidewall being formed with an opening into which the hook portion is inserted, wherein
   the hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface.

(2) The display device according to (1), wherein
   the side plate portion comprises a protection wall that faces a side surface of the hook portion and a surface on center side of the support surface; and
   the protection wall is connected, at an end of the protection wall, to a portion of the side plate portion adjacent to the hook portion.

(3) The display device according to (1), wherein
   the lower case further comprises a backlight that is stacked on the display panel and illuminates the display panel, and
   the lower case houses the backlight.

(4) The display device according to (1), further comprising a display cover that adheres to the display panel and to the upper case.

(5) An electronic apparatus comprising:
   a display device; and
   a control device that controls a display operation of the display device, wherein
   the display panel comprises a display surface that displays an image;
   an upper case comprising a support surface that supports the display surface of the display panel and a side plate portion that is provided along an outer edge of the support surface and extends from the outer edge of the support surface in a direction orthogonal to the display surface, the side plate portion being provided, at least at one place of the side plate portion, with a hook portion that projects on a surface on an outer circumferential side of the side plate portion in a direction orthogonal to a surface of the side plate portion; and a lower case comprising a bottom surface parallel to the display surface and a sidewall that is provided around the bottom surface, extends in a direction orthogonal to the bottom surface, and faces the outer circumferential side of the side plate portion, the sidewall being formed with an opening into which the hook portion is inserted, wherein the hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface.

The display device according to the present disclosure facilitates the fitting work and the removal work between the upper case and the lower case when the display device is manufactured or reworked. During the fitting work and the removal work between the upper case and the lower case, only the hook portions need to be elastically deformed. This can reduce a physical load applied to the whole of the upper case supporting the display panel and the lower case. Fitting to fix the upper case to the lower case can keep foreign matter from entering from a gap between the upper case and the lower case, and thus can keep the foreign matter from entering the periphery of the display panel.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
a display panel having a display surface that displays an image;
an upper case; and
a lower case,
the upper case comprising
a support surface that supports the display surface of the display panel and
a side plate portion that is provided along an outer edge of the support surface and extends from the outer edge of the support surface in a direction orthogonal to the display surface, the side plate portion being provided with:
a hook portion that is provided at least one place of the side plate portion and that projects on a surface on an outer circumferential side of the side plate portion in a direction orthogonal to a surface of the side plate portion; and
a protection wall that faces a side surface of the hook portion and a surface on center side of the support surface, and
the lower case comprising
a bottom surface parallel to the display surface, and
a sidewall that is provided around the bottom surface, extends in a direction orthogonal to the bottom surface, and faces the outer circumferential side of the side plate portion, the sidewall being formed with an opening into which the hook portion is inserted,
wherein the protection wall is connected, at an end of the protection wall, to a portion of the side plate portion adjacent to the hook portion;
wherein the hook portion is separated from the side plate portion in a direction along the outer circumferential side of the side plate portion,
wherein the hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface, and
wherein a space is formed between the protection wall and the hook portion, which allows the hook portion to be elastically deformed toward the protection wall.

2. The display device according to claim 1,
the lower case further comprises a backlight that is stacked on the display panel and illuminates the display panel, and
the lower case houses the backlight.

3. The display device according to claim 1, further comprising a display cover that adheres to the display panel and to the upper case.

4. An electronic apparatus comprising:
a display device; and
a control device that controls a display operation of the display device,
a display panel having a display surface that displays an image;
an upper case; and
a lower case,
the upper case comprising
a support surface that supports the display surface of the display panel and
a side plate portion that is provided along an outer edge of the support surface and extends from the outer edge of the support surface in a direction orthogonal to the display surface, the side plate portion being provided with:
a hook portion that is provided at least one place of the side plate portion and that projects on a surface on an outer circumferential side of the side plate portion in a direction orthogonal to a surface of the side plate portion; and
a protection wall that faces a side surface of the hook portion and a surface on center side of the support surface, and
the lower case comprising
a bottom surface parallel to the display surface, and
a sidewall that is provided around the bottom surface, extends in a direction orthogonal to the bottom surface, and faces the outer circumferential side of the side plate portion, the sidewall being formed with an opening into which the hook portion is inserted,
wherein the protection wall is connected, at an end of the protection wall, to a portion of the side plate portion adjacent to the hook portion;
wherein the hook portion is separated from the side plate portion in a direction along the outer circumferential side of the side plate portion, wherein the hook portion is inserted in the opening in a state in which no load is applied in a plane parallel to the support surface, and is elastically deformable toward center of the support surface up to a position not overlapping the opening when a portion inserted in the opening is pressed from outside of the support surface toward the center of the support surface, and wherein a space is formed between the protection wall and the hook portion, which allows the hook portion to be elastically deform toward the protection wall.

* * * * *